(12) United States Patent
Khandare et al.

(10) Patent No.: US 10,949,130 B2
(45) Date of Patent: Mar. 16, 2021

(54) VIRTUAL SOLID STATE STORAGE SYSTEM WITH SOLID STATE STORAGE ERROR EMULATION

(71) Applicant: Seagate Technology LLC, Fremont, CA (US)

(72) Inventors: Swapnil Rameshrao Khandare, Maharashtra (IN); Deepak Govind Choudhary, Maharashtra (IN)

(73) Assignee: Seagate Technology LLC, Fremont, CA (US)

( * ) Notice: Subject to any disclaimer, the term of this patent is extended or adjusted under 35 U.S.C. 154(b) by 4 days.

(21) Appl. No.: 16/229,815

(22) Filed: Dec. 21, 2018

(65) Prior Publication Data

US 2019/0347047 A1 Nov. 14, 2019

Related U.S. Application Data

(63) Continuation-in-part of application No. 15/976,044, filed on May 10, 2018, now Pat. No. 10,642,747.

(51) Int. Cl.
*G06F 3/06* (2006.01)
*G06F 30/331* (2020.01)

(52) U.S. Cl.
CPC .......... *G06F 3/0664* (2013.01); *G06F 3/061* (2013.01); *G06F 3/0614* (2013.01); *G06F 3/0659* (2013.01); *G06F 30/331* (2020.01)

(58) Field of Classification Search
CPC ..... G11C 29/42; G11C 29/52; G06F 11/1048; G06F 11/1068
USPC ......................................................... 711/203
See application file for complete search history.

(56) References Cited

U.S. PATENT DOCUMENTS

| 6,026,230 A | 2/2000 | Lin et al. |
| 7,607,005 B1 | 10/2009 | Lewis |
| 8,621,279 B1 * | 12/2013 | Antukh ............... G06F 11/3664 714/26 |

(Continued)

OTHER PUBLICATIONS

Ben Whitehead and Paul Morrison, "Four Steps to Verifying an SSD Controller With Emulation," (Oct. 2017); https://semiengineering.com/four-steps-to-verifying-an-ssd-controller-with-emulation/.

(Continued)

*Primary Examiner* — Titus Wong
(74) *Attorney, Agent, or Firm* — Taylor English Duma LLP

(57) ABSTRACT

A virtual solid state storage system is provided with solid state storage error emulation. An exemplary apparatus comprises a virtual solid state storage device configured to emulate a solid state storage device. The virtual solid state storage device comprises an interface that communicates with a solid state storage controller; an address translation module that translates memory addresses from a solid state storage-based memory space to a second memory space of a second memory device; and a non-solid state storage memory controller that communicates with the second memory device; and an error module to emulate solid state storage errors for testing error handling functions of the solid state storage controller for predefined error types of the solid state storage memory device by: (i) flipping bits sent to and/or read from the second memory device; and/or (ii) changing a status response sent to the solid state storage controller.

18 Claims, 11 Drawing Sheets

(56) References Cited

U.S. PATENT DOCUMENTS

| | | | | |
|---|---|---|---|---|
| 8,707,104 | B1* | 4/2014 | Jean | G06F 11/1048 714/41 |
| 2007/0050668 | A1* | 3/2007 | Gans | G06F 11/1048 714/6.11 |
| 2008/0215798 | A1* | 9/2008 | Sharon | G11C 11/5628 711/103 |
| 2008/0306723 | A1 | 12/2008 | DeAmbroggi et al. | |
| 2012/0066568 | A1* | 3/2012 | Komagome | G06F 11/1016 714/764 |
| 2014/0143617 | A1* | 5/2014 | Griffin | G11C 16/349 714/718 |
| 2015/0033065 | A1* | 1/2015 | Canepa | G06F 11/1008 714/6.11 |
| 2015/0380087 | A1* | 12/2015 | Mittelholzer | H03M 13/2767 714/766 |

OTHER PUBLICATIONS

Yoongu Kim et al., "Flipping Bits in Memory Without Accessing Them: An Experimental Study of DRAM Disturbance Errors," Intel Labs, Carnegie Mellon University, 2014, 12 pages; https://users.ece.cmu.edu/~yoonguk/papers/kim-isca14.pdf.

Jie Guo et al., "DPA: A Data Pattern Aware Error Prevention Technique for NAND Flash Lifetime Extension", Department of Electrical & Computer Engineering, University of Pittsburgh, Pittsburgh, Apr. 11, 2014, 23 pages; http://www.aspdac.com/aspdac2014/technical_program/pdf/7A-2.pdf.

Yusuke Yamaga et al., "Real Usage-Based Precise Reliability Test by Extracting Read/Write/Retention-Mixed Real-life Access of NAND Flash Memory from System-Level SSD Emulator," Chuo University, Tokyo, Japan , 2017, 5 pages; https://ieeexplore.ieee.org/document/7936394/.

Antonios Prodromakis et al., "MLC NAND Flash Memory: Aging Effect and Chip/Channel Emulation," Microprocessors and Microsystems 39 (2015) 1052-1062; http://www.loe.ee.upatras.gr/Comes/Papers/2015_MICPRO%20-%20MLC%20NAND%20Flash%20memory.pdf.

Yu Cai, et al., "Read Disturb Errors in MLC NAND Flash Memory: Characterization, Mitigation, and Recovery," (Jun. 2015); http://technodocbox.com/Computer_Peripherals/67469917-Read-disturb-errors-in-mlc-nand-flash-memory-characterization-mitigation-and-recovery.html.

* cited by examiner

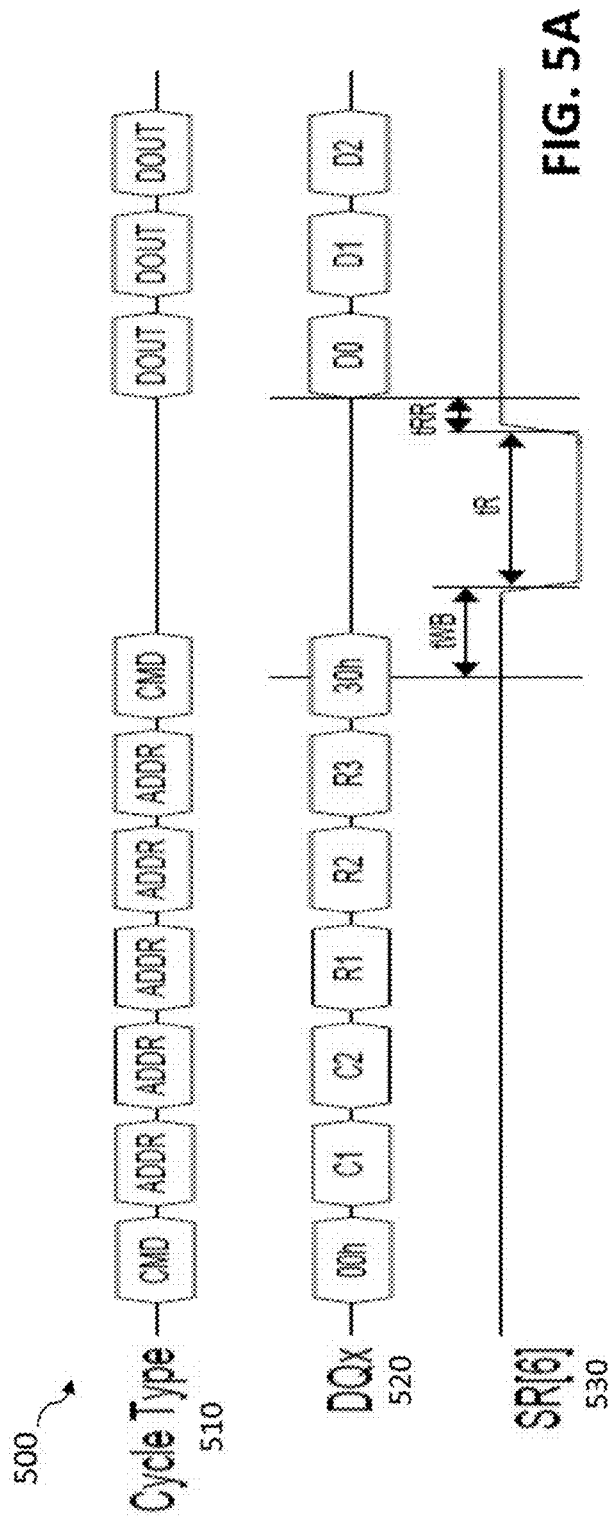

VIRTUAL SOLID STATE STORAGE SYSTEM WITH SOLID STATE STORAGE ERROR EMULATION

CROSS-REFERENCE TO RELATED APPLICATION(S)

The present application is a continuation-in-part of U.S. patent application Ser. No. 15/976,044, filed May 10, 2018, entitled "Virtual Flash System," incorporated by reference herein in its entirety.

SUMMARY

In at least one embodiment, an apparatus comprises a virtual solid state storage device configured to emulate a solid state storage device, the virtual solid state storage device comprising: a solid state storage interface configured to communicate with a solid state storage controller; an address translation module configured to translate memory addresses from a solid state storage-based memory space to a second memory space of a second memory device; and a non-solid state storage memory controller configured to communicate with the second memory device; and a solid state storage error module to emulate solid state storage errors for testing one or more error handling functions of the solid state storage controller for one or more predefined error types of the solid state storage memory device by one or more of: (i) flipping one or more bits one or more of: sent to and read from the second memory device; and (ii) changing a status response sent to the solid state storage controller for one or more solid state storage commands to a predefined status response.

In at least one embodiment, a method comprises configuring a virtual solid state storage device to emulate a solid state storage memory device, the virtual solid state storage device comprising: a solid state storage interface configured to communicate with a solid state storage controller; an address translation module configured to translate memory addresses from a solid state storage-based memory space to a second memory space of a second memory device; and a non-solid state storage memory controller configured to communicate with the second memory device; testing one or more error handling functions of the solid state storage controller using a solid state storage error module to emulate solid state storage errors for one or more predefined error types of the solid state storage memory device by one or more of: (i) flipping one or more bits one or more of: sent to and read from the second memory device; and (ii) changing a status response sent to the solid state storage controller for one or more solid state storage commands to a predefined status response.

In at least one embodiment, a device comprises a virtual solid state storage device configured to emulate a solid state storage memory device, the virtual solid state storage device comprising: a solid state storage interface configured to communicate with a solid state storage controller; and an address translation module configured to translate memory addresses from a solid state storage-based memory space to a second memory space of a second memory device; a solid state storage error module to emulate solid state storage errors for testing one or more error handling functions of the solid state storage controller for one or more predefined error types of the solid state storage memory device by one or more of: (i) flipping one or more bits one or more of: sent to and read from the second memory device; and (ii) changing a status response sent to the solid state storage controller for one or more solid state storage commands to a predefined status response; and a non-solid state storage memory controller configured to communicate the emulated solid state storage errors to the second memory device.

Other illustrative embodiments include, without limitation, systems and computer program products comprising processor-readable storage media.

BRIEF DESCRIPTION OF THE DRAWINGS

FIGS. 5A and 5B illustrate various signals for a typical read operation and for a read operation with one or more emulated read errors, respectively, in accordance with certain embodiments of the present disclosure;

DETAILED DESCRIPTION

Figure 1:
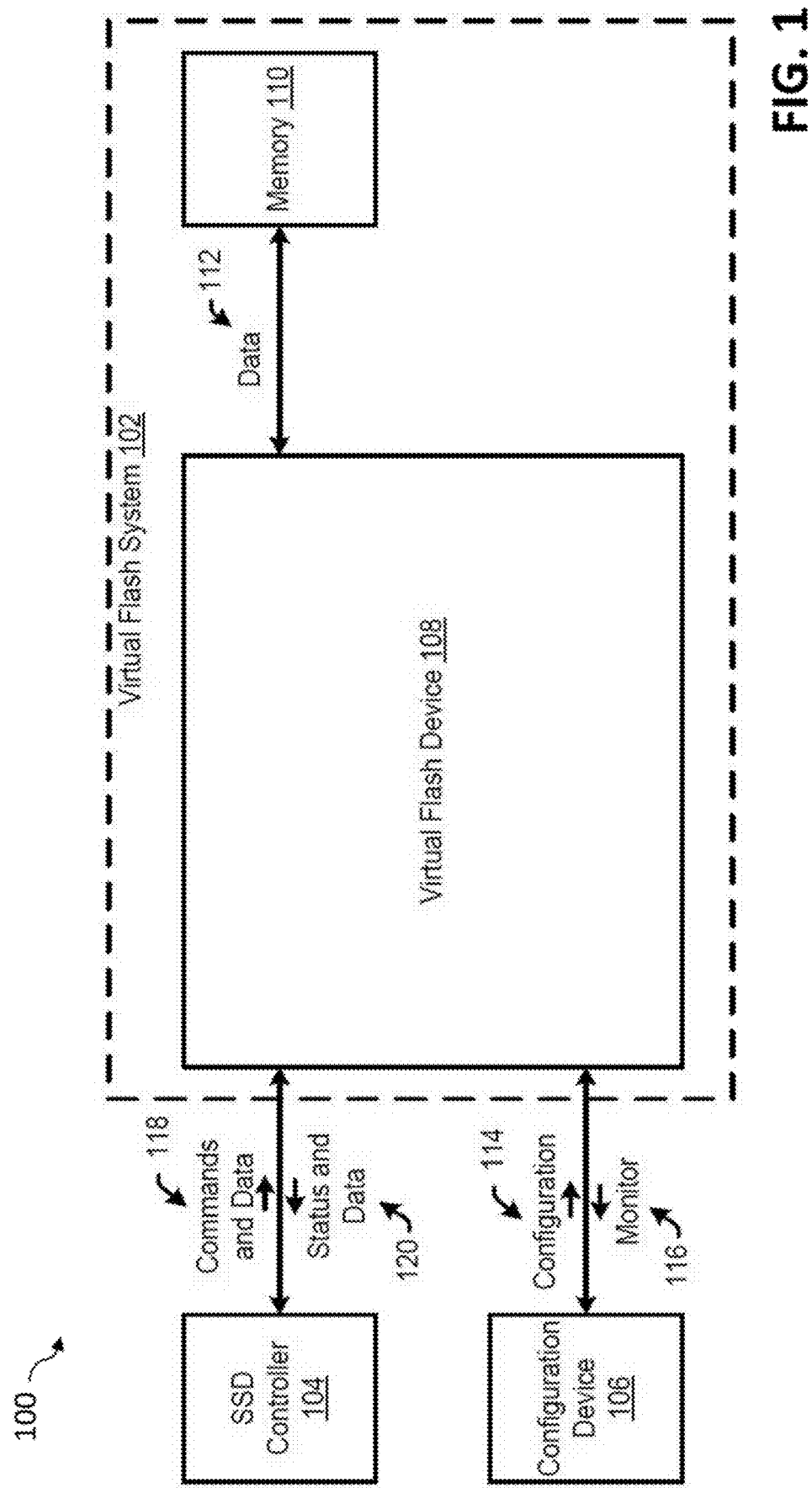
FIG. 1 is a block diagram of an illustrative system that includes a virtual flash system that may emulate a flash storage device to a flash storage controller, in accordance with certain embodiments of the present disclosure.

Illustrative embodiments will be described herein with reference to exemplary solid state storage devices, as well as virtual solid state storage devices, and associated storage media, controllers, and other processing devices. It is to be appreciated, however, that these and other embodiments are not restricted to the particular illustrative system and device configurations shown. Accordingly, the terms "solid state storage device" and "virtual solid state storage device," as used herein, are intended to be broadly construed, so as to encompass, for example, any storage device implementing the flash error emulation techniques described herein.

Numerous other types of storage systems are also encompassed by the term "solid state storage device" and "virtual solid state storage device," as those terms are broadly used herein.

While one or more exemplary embodiments provide techniques for error emulation using a virtual flash system, the solid state storage error emulation techniques described herein may be employed to emulate errors in any solid state memory type, as would be apparent to a person of ordinary skill in the art.

In the following detailed description of the embodiments, reference is made to the accompanying drawings which form a part hereof, and in which are shown by way of illustrations. The features of the various embodiments and examples described herein may be combined, exchanged, removed, other embodiments utilized, and structural changes made without departing from the scope of the present disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

In accordance with various embodiments, dedicated hardware implementations including, but not limited to, application specific integrated circuits, programmable logic arrays, and other hardware devices can be constructed to implement the methods and functions described herein. Further, the methods and functions described herein may be implemented as a device, such as a memory device, including instructions that when executed cause a processor to perform the methods.

Flash controllers have hardware and software algorithms to handle flash errors. One or more embodiments of the disclosure recognize that the testing of the flash controller and the algorithms of the flash controller for error handing is difficult, since one needs a flash device with that specific error. Producing errors on flash is a difficult job, since it takes thousands of programs and erase cycles to produce wear. The exact intensity of wear and other errors is difficult to generate, since there is no precise control over it. Even if desired wear is generated, reproducing the same errors on other flash devices is difficult, since all flash devices have different characteristics based on production considerations. Hence, the algorithms and methods used to detect flash errors and/or correct data, because of flash errors takes a significant amount of time for development and testing.

The present disclosure generally relates to devices and systems for testing error functionality of a flash storage controller using a virtual flash system, and in some embodiments, the present disclosure relates to devices and systems that may emulate a flash storage device to a flash storage controller to allow for testing error functionality of the operation of the flash storage controller. In one or more embodiments, a virtual flash device (e.g., NAND (Not And (electronic logic gate)) emulator) and a flash error emulation module, described further below, are used to emulate flash errors and thereby enable the testing of the error correction methods associated with such flash errors in short time.

Testing error functionality of flash controllers using flash storage may require long test cycles as flash storage devices may take thousands of program and erase (PE) cycles or read (RD) operations, for example, to exhibit the desired error types (e.g., read errors and/or program errors), respectively. For example, when a flash controller sends a program page command to a virtual flash, the page data is saved in a DDR SDRAM (double data rate synchronous dynamic random access memory), as discussed further below. Likewise, when a read command is sent by the flash controller to a virtual flash, the data of this page is read from the DDR SDRAM and made available to the host for reading. Further issues may arise due to logistics involved in procuring suitably worn or conditioned flash storage and attempting to track various error types, flash storage wear or condition.

Some implementations of the technology described herein include a virtual flash system that may emulate a flash storage device including a variety of flash behavior. Some examples may include a programmable circuit which is connectable between a flash storage controller (e.g., an SSD (solid state device) controller) and a memory device (e.g., a DDR SDRAM memory). Some implementations may also avoid the above noted problems and other problems associated with the non-repeatable nature of flash errors, and/or flash due to its wear, use or non-use characteristics and other real-world variations.

For example, some implementations may simulate flash error behaviors or conditions in a controllable manner, such that different flash error behaviors or scenarios can be emulated in order to test the error functionality of the flash controller. In many flash storage devices, each time a program or erase operation is performed on a flash storage cell (e.g., usually as a group such as a page or block), an error may occur. The number of the cycles a memory may perform before an error occurs may be variable and unpredictable. However, the disclosed flash error emulation techniques allow the controller to be tested for its ability to handle predefined flash errors. Alternatively or additionally, implementations may simulate flash behavior that may change the contents of the flash storage due to simulate various flash errors (e.g., read errors and program errors). By emulating a flash storage device including such simulated flash behavior, implementations may allow for the testing of error functionality of the flash controller using the virtual flash system, thereby allowing such flash behaviors to be tested.

Among other benefits, the disclosed flash error emulation techniques make it possible to emulate flash errors of desired intensity in a small amount of time. Hence, the flash controller can be tested for flash error handling.

The disclosed flash error emulation techniques can be used to reduce risks and challenges associated with the development of SSD controller devices. For example, to improve data reliability, the disclosed flash error emulation techniques can be used to validate some or all protocol errors. To reduce software complexity the disclosed flash error emulation techniques can be used to start firmware development months before an actual NAND flash device, for example, is available for testing (or comes to market). There are also significant time savings associated with producing flash protocol error scenarios.

In addition, the disclosed flash error emulation techniques provide significant cost savings, as there is no need to wear out an actual NAND flash device, as well as an ability to consistently reproduce error issues. In one or more embodiments, the user has complete control for generating flash protocol error conditions.

Although the examples herein may be illustrated and described in the context of SSD controllers, this is merely for ease of discussion. Further, embodiments of the disclosed subject matter are not limited to this context. For example, the techniques and systems disclosed may be used with any flash storage controller similar to or which provide similar functionality to those of SSD controllers.

Referring to FIG. 1, a block diagram is shown of a system that includes a virtual flash system 102 that may emulate a flash storage device to a flash storage controller and which is generally designated 100. The components of system 100 may include a virtual flash system 102 coupled to an SSD controller 104 and a configuration device 106. Further, the virtual flash system 102 may include a virtual flash device 108 coupled to a memory 110. The virtual flash device 108 may connect to and emulate a flash storage device to the SSD controller 104 using the memory 110 as storage for data 112 that would otherwise be stored to the emulated flash storage device. The configuration device 106 may be coupled to the virtual flash system 102 and may be operable to program or configure the virtual flash system 102. In some implementations, the form factor of the virtual flash system 102 may be configured to match the form factor of the flash storage device being emulated or a standard form factor for flash storage devices.

In operation, the configuration device 106 may send configuration information 114 to the virtual flash device 108 and receive monitor information 116 from the virtual flash device 108. For example, the configuration information 114 may include the type of flash storage device to be emulated, the condition of the flash storage device to be emulated, and what monitoring should be done, and so on.

The virtual flash device 108 may be capable of supporting many or all flash protocols and speed variants. For example, the virtual flash device 108 may support some or all of the following flash protocols:
1. Asynchronous;
2. ONFI2 (Open NAND Flash Interface 2)—Source Synchronous;
3. ONFI3-NV (Non-Volatile) DDR;
4. ONFI3-NV DDR2;
5. ONFI4-NV DDR;
6. ONFI4-NV DDR2;
7. Toggle2; and
8. Toggle3.

The flash error emulation conditions to be emulated may include a variety of predefined error types of the flash memory device including, for example, read errors, program errors, erase errors, block failures, die failures, and read only mode/end of life mode errors. A number of exemplary predefined error types of the flash memory device are discussed further below in conjunction with FIGS. 5A through 10.

The virtual flash device 108 may receive the configuration information 114 from the configuration device 106, configure the virtual flash system 102 for operation and then connect to and emulate a flash storage device to the SSD controller 104 using the memory 110 as storage for data 112 that would otherwise be stored to the emulated flash storage device. The virtual flash device 108 may also provide monitor information 116 to the configuration device 106.

As mentioned above, the virtual flash device 108 may return monitor information 116 to the configuration device 106. The specific information returned as monitor information may vary from implementation to implementation. For example, the monitor information may range from detailed metadata and complete system state dumps to very high-level performance reports. In some examples, the monitor information may include PE or RD counts, a bad block map, and so on. Though not shown, additional monitor information may be received from the SSD controller.

Once the virtual flash device 108 has configured the system for operation, the SSD controller 104 may begin issuing commands (e.g., read, write, erase, etc.) and write data 118 to the virtual flash device 108 while receiving status information and read data 120. As the interface between the SSD controller 104 and virtual flash device 108 is intended to emulate the communications between the SSD controller and the emulated flash storage device, one of ordinary skill in the art would understand the particulars of the communication in view of this disclosure.

In some implementations, the virtual flash device 108 may operate such that all the processing for the write path and read path, along with the behavior modeling and bookkeeping of meta-data is contained within the virtual flash device 108. In addition, the virtual flash device 108 may perform address translation between an emulated address space of the emulated flash storage device and an address space of the memory 110. In other words, such implementations may include a virtual flash device 108 which operates such that the SSD controller 104 operates as if connected to a normal flash storage device, the memory 110 has no specialized functionality, and the configuration device 106 may not need to be involved after providing configuration information (e.g., other than receiving any desired real time monitor information). However, configuration device 106 may input changes to the virtual flash device on the fly (e.g., instructing the virtual flash device 108 to introduce a new emulated failure on the fly, requesting the virtual flash device 108 dump the entire state of the virtual flash system 102, requesting the virtual flash device 108 provide different or additional monitor information, etc.).

In some implementations, the virtual flash device 108 may be a field-programmable gate array (FPGA). An FPGA may be an integrated circuit designed to be configured by a customer or a designer after manufacturing (e.g., "field-programmable"). FPGAs may contain an array of programmable logic blocks and a hierarchy of reconfigurable interconnects that may allow the blocks to be "wired together", like many logic gates that can be inter-wired in different configurations. Logic blocks may be configured to perform complex combinational functions, or simple logic gates like AND and XOR. In some FPGAs, logic blocks may also include memory elements, which may be simple flip-flops or more complete blocks of memory.

The memory 110 is not limited to a specific type of memory and may be any sufficiently fast digital storage. Some implementations may use a memory that does not exhibit wear (e.g., DDR SDRAM memory). In the case of using a DDR memory, multilevel cell flash and triple level cell flash can be emulated using two or three DDR SDRAM memory bits per flash cell, respectively.

Figure 2:
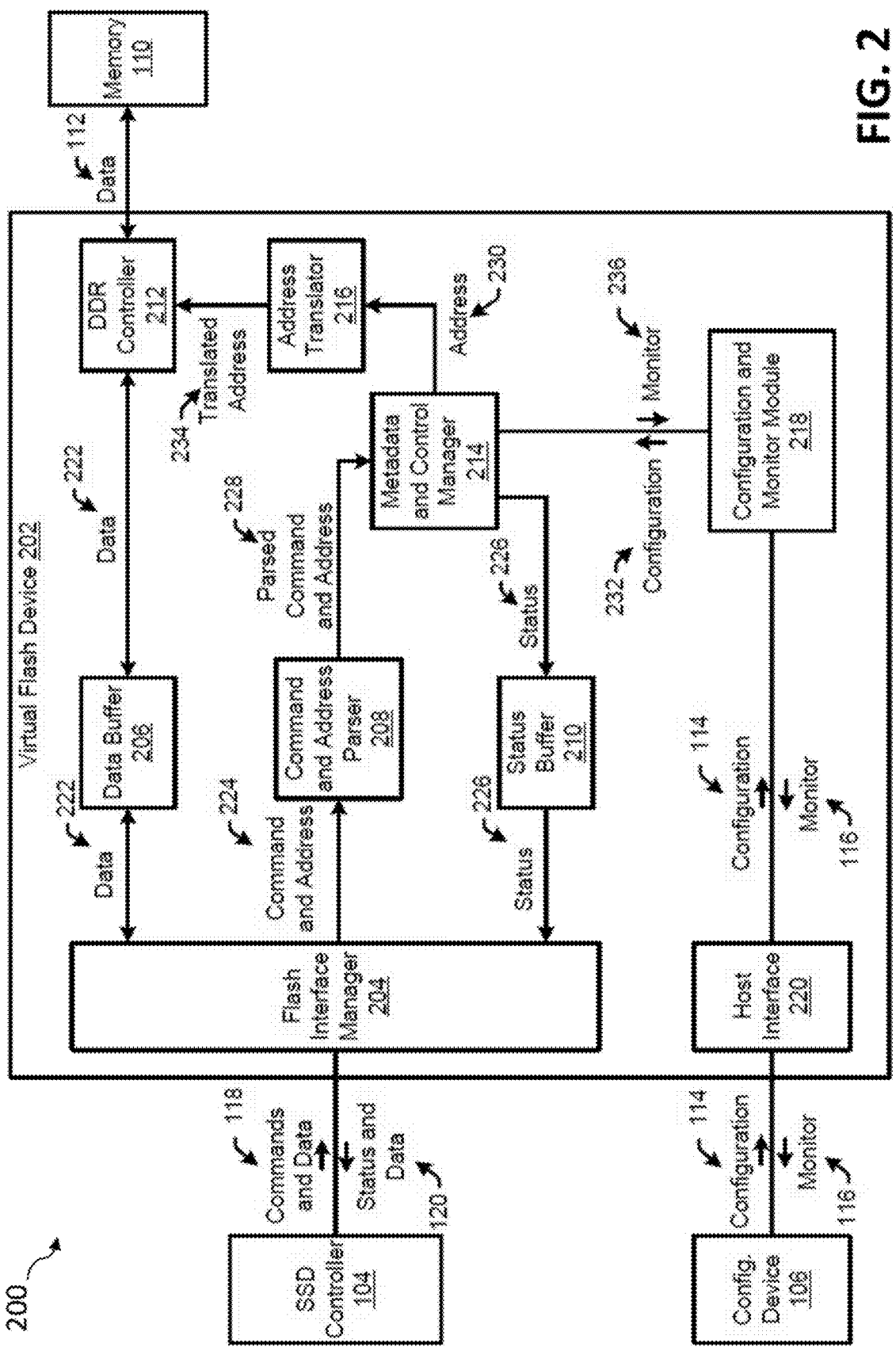
FIG. 2 is a block diagram of an illustrative system that includes a virtual flash device that may emulate a flash storage device to the flash storage controller, in accordance with at least one embodiment of the present disclosure.

Referring to FIG. 2, a block diagram is shown of a system that includes a virtual flash device 202 that may emulate a flash storage device to a flash storage controller and which is generally designated 200. More particularly, in the example system 200 illustrated in FIG. 2, the virtual flash device 202 may be an example of a type of virtual flash device that emulates the behavior of a flash storage device in good condition. Such implementations may be used for testing flash storage controllers for normal operation. Such testing using actual flash storage devices may suffer due to lack of knowledge of whether a failure was caused by bugs in the flash controller or the flash controller firmware or unknown wear or failure in the flash storage device. The components of the virtual flash device 202 may operate in a similar manner to the virtual flash device 108 discussed above with regard to FIG. 1. As such, discussion of the general functions of the virtual flash device 202 and a description of similar operations will not be repeated for sake of brevity.

The virtual flash device 202 may include a flash interface manager 204 that may interface with the SSD controller 104 and that may be coupled to a data buffer 206, a command and address parser 208, and a status buffer 210. The data buffer 206 may be coupled to a DDR controller 212 that may interface with the memory 110. The command and address parser 208 may be coupled to a metadata and control manager 214 which is in turn coupled to the status buffer 210, an address translator 216 and a configuration and monitor module 218. The address translator 216 may be coupled to the DDR controller 212. Finally, the configuration and monitor module 218 may be coupled to a host interface 220 that may interface with the configuration device 106.

In operation, the flash interface manager 204 may receive the commands and data 118 from the SSD controller 104. The flash interface manager 204 may provide the data portion of 118 to the data buffer 206 as data 222 and provide the command portion of 118 to the command and address parser 208 as command and address 224. Further, the flash interface manager 204 may receive read data 222 from the data buffer 206 and status information 226 from the status buffer 210. The flash interface manager 204 may then output the received status and read data as status and data 120.

The data buffer 206 may operate as a buffer for the flash interface manager 204 and DDR controller 212. More particularly, the data buffer 206 may buffer write data from the SSD controller 104 until the associated command is processed and the DDR controller 212 is ready to output the write data to the memory 110. Similarly, the data buffer 206 may buffer read data from the memory 110 until the associated command is processed, associated status information 226 is prepared and the flash interface manager 204 is ready to output the status information and read data to the SSD controller 104. The status buffer 210 may operate in a similar manner as a buffer for the flash interface manager 204. For example, the status buffer 210 may buffer status information 226 until an associated read command is processed and the flash interface manager 204 is ready to output the status information 226 and associated read data to the SSD controller 104.

The command and address parser 208 may operate to receive the command and address 224 from the flash interface manager 204. The command and address parser 208 may then parse the command and address 224 from the format used by the SSD controller 104 into a parsed command and address 228 in a format usable by the metadata and control manager 214.

The host interface 220 may interface with the configuration device 106 and the configuration and monitor module 218. As such, the host interface may receive the configuration information 114 from the configuration device 106 and send the configuration information 114 to the configuration and monitor module 218. Further, the host interface 220 may receive monitor information 116 from the configuration and monitor module 218 and send the monitor information 116 data to the configuration device 106. The particular protocol used by the host interface when communicating with the configuration device 106 may vary. In some implementations, the host interface 220 may communicate with the configuration device 106 using an Ethernet interface.

The configuration and monitor module 218 may receive configuration information 114 from the host interface 220 and return monitor information 116 to the host interface 220. The configuration and monitor module 218 may utilize the configuration information 114 and generate an initial configuration for the virtual flash device 202. The initial configuration may be provided to the metadata and control manager 214 as configuration information 232. The configuration and monitor module 218 may receive monitor information 236 from the metadata and control manager 214. The monitor information 236 may be the same as monitor information 116 or may differ. Examples of monitor information 236 which differ from monitor information 116 may include raw monitor information, monitor information including additional internal information, monitor information in an alternative format, etc. In some implementations, the configuration and monitor module 218 may update the configuration information 232 during operation, for example, based on changes in the configuration information 114 during operation, based on the monitor information 236 and so on (e.g., instructing the virtual flash device 202 to introduce a new emulated failure on the fly, requesting the virtual flash device 202 dump the entire state of the virtual flash system 102, requesting the virtual flash device 108 provide different or additional monitor information, a determination that the metadata indicates a threshold has been reached, etc.). Additional discussion of a configuration and monitor module 218 updating the configuration information 232 based on monitor information 236 is provided below with regard FIG. 3.

The metadata and control manager 214 may receive the configuration information 232 from the configuration and monitor module 218. Based on the received configuration information 232, the metadata and control manager 214 may configure or program various components of the virtual flash device 202 to emulate the indicated flash storage device, to emulate any indicated flash behavior (e.g., wear, threshold voltage shift, failures, etc.), to perform the internal operations to perform the emulation, and to perform the indicated monitoring. For example, the metadata and control manager 214 may configure the parsing operation of the command and address parser 208 as well as the address translation operation of the address translator 216. In another example, the metadata and control manager 214 may configure the interface provided to the SSD controller 104 by the flash interface manager 204. More particularly, the flash interface manager 204 may implement a parametric ONFI2/3/4 or Toggle2/3 or Async device interface. The interface may be "parametric" in the sense that its behavior in terms of signal timing may be controllable via parameters. The metadata and control manager 214 may further configure the status information provided to the SSD controller 104 by the flash interface manager 204. Example status information that may be maintained by the flash interface manager 204 as part of the parametric interface may include an ONFIx/ToggleX status register, a read latency parameter, a device ready parameter, a device fail parameter, and a detection threshold. Of course, these examples are not limiting and the status information provided may vary based on the type of flash storage device being emulated (e.g., based on the standard or specifications of the emulated flash storage device).

During emulation, the metadata and control manager 214 may receive the parsed command and address 228 from the command and address parser 208. Based on the parsed command and address 228, the metadata and control manager 214 may operate to perform book-keeping of metadata for the virtual flash device 202. The metadata being stored may vary from implementation to implementation depending on the desired emulation scenario. For example, some implementations may include metadata such as one or more of a list of all commands and respective addresses received by the virtual flash system with time stamps, what statuses were returned for those commands, and various counters (e.g., read cycle counters, program/erase cycle counters, etc.), and so on. Some example implementations may utilize such metadata for debugging SSD controller failures or to improve performance of the SSD controller. In some examples, the counters may be used cross check if firmware counters are working properly. The counters may also be used to check if all SSD algorithms like wear leveling are working as expected. Examples of the metadata are discussed with regard to FIGS. 3-11. In addition, the metadata and control manager 214 may provide the address 230 to the address translator 216.

The address translator 216 may operate to translate addresses between the addressing scheme of the indicated flash storage device to be emulated and the DDR memory addressing scheme.

The DDR controller 212 may operate to store data 112 to and retrieve data 112 from the memory 110. The memory address of the memory 110 that the DDR controller stores data to or retrieves data from may be a translated address 234 from the address translator 216.

The virtual flash device 202 may include functionality to save and restore the current state of the virtual flash device 202 and memory 110 to the configuration device 106. For example, the configuration device 106 may initiate the save process as part of the configuration information sent to the virtual flash device 202 during an emulation operation. The configuration and monitor module 218 may receive the save request and issue instructions to various components of the virtual flash device 202 and the memory 110 to suspend operation and provide a copy of the current state of the components to the configuration and monitor module 218. Upon receiving the current state data, the configuration and monitor module 218 may return the current state data to the configuration device as monitor information 116. The operations of the virtual flash device 202 may then resume or remain suspended. Subsequently, a similar process may be utilized to restore the virtual flash device to the saved state.

Figure 3:
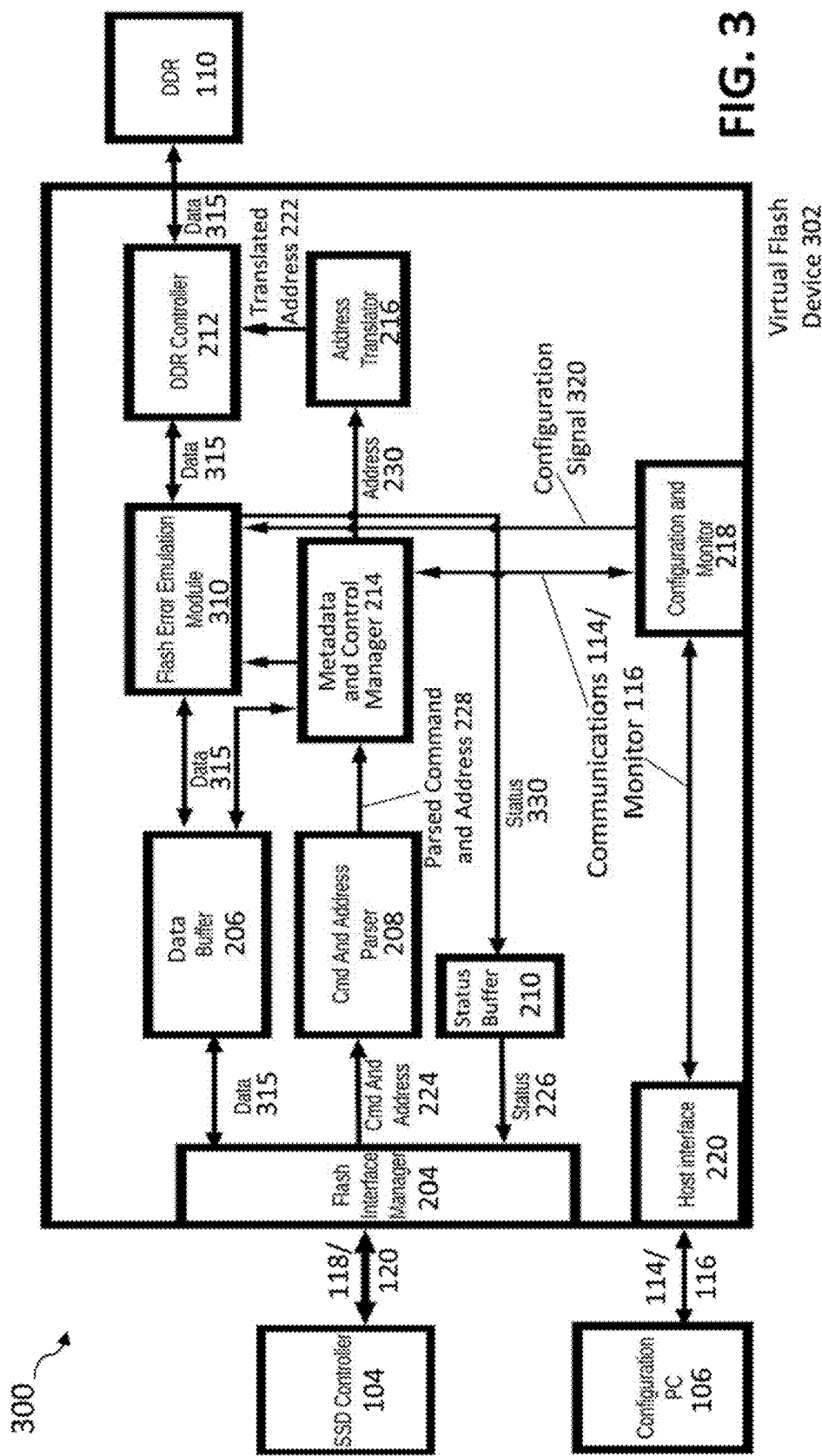
FIG. 3 is a block diagram of an illustrative system that includes a virtual flash device that may emulate a flash storage device to a flash storage controller with flash error emulation, in accordance with an embodiment of the present disclosure.

FIG. 3 is a block diagram of an illustrative system 300 that includes a virtual flash device 302 that may emulate a flash storage device to an SSD (e.g., flash) storage controller 104 with flash error emulation, in accordance with an embodiment of the present disclosure.

More particularly, in the example system 300 illustrated in FIG. 3, the virtual flash device 302 may be an example of a type of virtual flash device that emulates flash errors in a flash storage device. Such implementations may be used for testing the ability of flash storage controllers to handle flash errors. As discussed above, such testing using actual flash storage devices may suffer due to lack of repeatability and difficulty in obtaining suitable test flash storage devices. The components of the virtual flash device 302 may operate in a similar manner to the virtual flash devices 108 and 202 discussed above with regard to FIGS. 1 and 2. As such, discussion of the general functions of the virtual flash device 302 and a description of similar operations will not be repeated for sake of brevity.

In addition to the components of the virtual flash device 202 of FIG. 2, the virtual flash device 302 of FIG. 3 may include a flash error emulation module 310. In the example illustrated in FIG. 3, the flash error emulation module 310 is positioned on the data path between the data buffer 206 and the DDR controller 212. In this manner, the flash error emulation module 310 can control data 315 being read from, and/or programmed to, the DDR 110. The flash error emulation module 310 can flips bits, for example, in data 315 being sent to the DDR 110 and/or in data 315 read from the DDR 110. In addition, the exemplary flash error emulation module 310 is also connected to the status buffer 210, which holds the flash status responses 330 to be sent back to the SSD controller 104. Thus, with respect to a program operation, the program data between the flash error emulation module 310 and the DDR 110 is potentially modified by the flash error emulation module 310, as discussed further below for a number of exemplary predefined error types. Likewise, with respect to a read operation, the read data between the flash error emulation module 310 and the flash interface manager 204 is potentially modified by the flash error emulation module 310. The exemplary flash error emulation module 310 can optionally change the status response 330 for desired flash commands in one or more embodiments.

The flash error emulation module 310 is also coupled to the metadata and control manager 214, discussed above, and the configuration and monitor module 218. In some implementations, the configuration and monitor module 218 generates a configuration signal 320 that is sent to the flash error emulation module 310 for configuring the type of error response that should be sent for a particular request. For example, from the configuration device 106, a user can configure the virtual flash device 302 to send a busy status for a program command on a particular flash page to emulate a program error. This user configuration request will be sent by the configuration and monitor module 218 to the flash error emulation module 310 as a configuration signal 320. Generally, the configuration signal 320 provides an indication to the flash error emulation module 310 of the type of error to send for a given type of request.

In one or more embodiments, the exemplary flash error emulation module 310 is configured for error emulation with the following information:

1. Page Address (e.g., die, plane, block and page number) to be targeted for errors.
2. Type of Error: Read, Program, Erase, Die Failure, Block Failure, Read Only Mode.
3. Type of Response: Fail Status, Busy Status, Corrupted Data, All Ones (1s) Data (e.g., an erased page).
4. Trigger: No Trigger, Erase Count, Read Count.

A specific page, block or die can be configured to emulate one or more errors, through the configuration data 114 sent from the configuration PC 106. As shown in FIG. 3, the exemplary configuration data 114 goes through the host interface 220 (e.g., an Ethernet interface) to the configuration and monitor module 218. The configuration and monitor module 218 then sends the error emulation related details as the configuration information 320 to the flash error emulation module 310.

The flash error emulation module 310 can be configured to introduce one or more errors on, for example, a page, block, and/or die, based on certain counts, such as an erase count, and a read count. In some embodiments, the metadata and control manager 214 tracks various counts, such as the erase count, the read count, and/or a program count. When a given count reaches a specific threshold, the metadata and control manager 214 programs the flash error emulation module 310 to send one or more errors for the page or block which has crossed the threshold.

Figure 4:
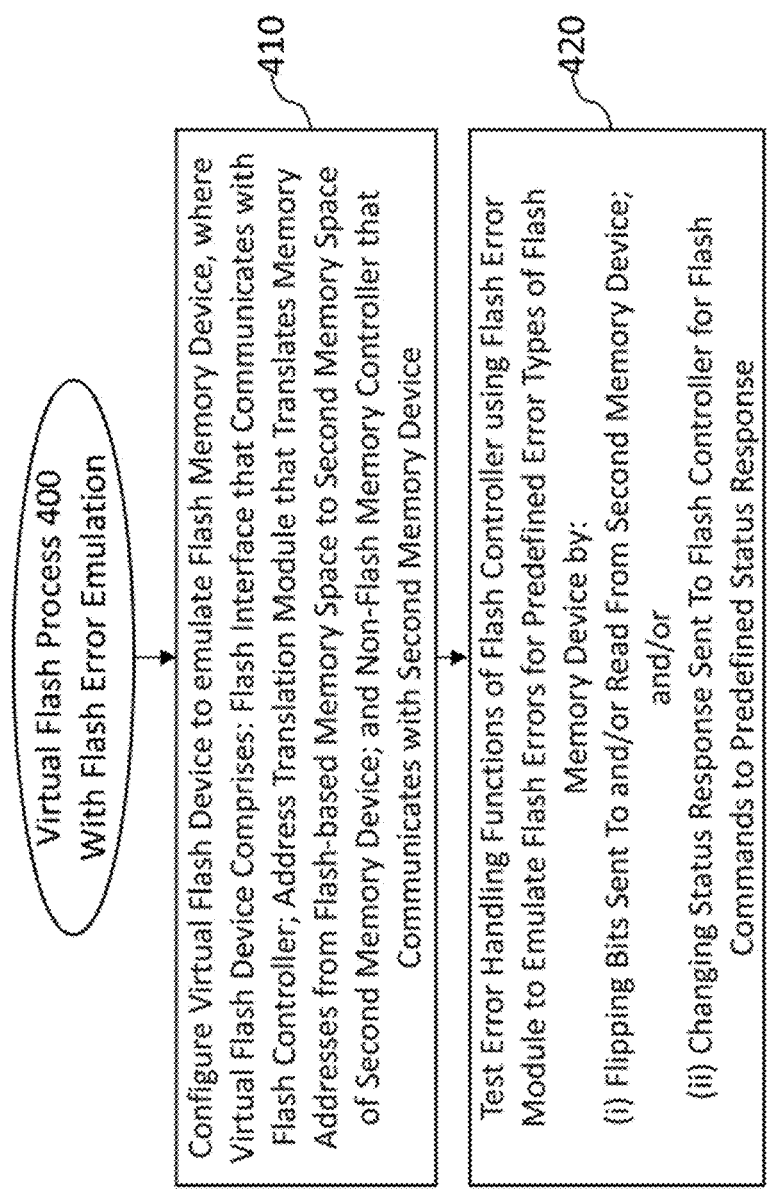
FIG. 4 is a flow chart illustrating an exemplary implementation of a virtual flash process with flash error emulation, according to one embodiment of the disclosure.

FIG. 4 is a flow chart illustrating an exemplary implementation of a virtual flash process 400 with flash error emulation, according to one embodiment of the disclosure. As shown in FIG. 4, the exemplary virtual flash process 400 initially configures the virtual flash device 302 to emulate a flash memory device during step 410. In some embodiments, the virtual flash device 302 comprises a flash interface manager 204 that communicates with an SSD controller 104, such as a flash controller; an address translation module 216 that translates memory addresses from a flash-based memory space of the emulated flash memory device to a second memory space of a second memory device, such as the DDR memory 110; and a DDR controller 212, such as a non-flash memory controller that communicates with the second memory device 110.

During step 420, the exemplary virtual flash process 400 tests the error handling functions of the SSD controller 104 using a flash error emulation module 310 to emulate flash errors for one or more predefined error types of the emulated flash memory device. In one or more embodiments, the emulated flash errors are emulated by: (i) flipping bits sent to and/or read from the second memory device 110; and/or (ii) changing a status response 330 sent to the flash controller 104 for one or more flash commands to a predefined status response, discussed further below.

Exemplary Emulated Flash Error Types

As noted above, the flash error emulation conditions to be emulated by the flash error emulation module 310 may include a variety of predefined error types of the flash memory device including, for example, read errors, program errors, erase errors, block failures, die failures, and read only mode/end of life mode errors. A number of exemplary predefined error types of the flash memory device are discussed hereinafter in conjunction with FIGS. 5A through 10.

Read Error Emulation

In some embodiments, if a user configures a page, for example, for a read error, the user can specify the type of response to send for a read error from the following exemplary list (each discussed separately below):
 a. Busy Status;
 b. Incorrect Data; and
 c. All 1s Data.

Busy Status:

If a user configures a page, for example, to fail read operations with a busy response, then the flash error emulation module 310, in response to receiving a read command, checks if the current page is configured for read errors. If the current page is configured for read errors, the flash error emulation module 310 will set the busy bit using a status 330 stored in the status buffer 210.

As the SSD controller 104 sends Read Status/Read Status Enhanced commands to identify a completion of the read command, the SSD controller 104 will continue to receive a busy response from the virtual flash device 302.

Incorrect Data:

If a user configures a page, for example, to fail read operations with incorrect data, then the flash error emulation module 310, in response to receiving a read command, checks if the current page is configured for read errors. If the current page is configured for read errors, the flash error emulation module 310 will introduce one or more random bit flips from the data 315 that was read from the DDR 110 and make the modified data 315 available in the data buffer 206 for the SSD controller 104 to read. In this manner, as the SSD controller 104 reads out the data 315, the SSD controller 104 will receive the modified data with the one more flipped bits.

All 1s Data:

If a user configures a page, for example, to fail read operations with an all 1s pattern, then the flash error emulation module 310, in response to receiving a read command, checks if the current page is programmed for read errors. If the current page is configured for read errors, the flash error emulation module 310 will set an all 1s pattern in the data buffer 206 and make the modified data 315 available for the SSD controller 104 to read. In this manner, as the SSD controller 104 reads out the data 315, the SSD controller 104 will receive the modified data 315 with an erased page. An example of using the exemplary all 1s pattern to emulate read errors is discussed in conjunction with FIG. 5B.

FIG. 5A illustrates various signals 500 for a typical read operation, in accordance with certain embodiments of the present disclosure. As shown in FIG. 5A, for a typical read operation, the cycle type 510 identifies the information type of what is transferred for each clock cycle, and the DQx [Data Bus] signal 520 indicates what is actually transferred for each clock cycle. In the exemplary embodiment, a read operation starts with the 00h command (e.g., a dummy address cycle), followed by five address cycles C1-C2 and R1-R3 to identify the target read location, then the 30h command is transferred to confirm the read command sequence. After a read transfer time (where the SR[6] [Status Register $6^{th}$ bit] signal 530 comprises times tWB [(WE_n high or CLK rising edge) to SR[6] low], tR [read time] and tRR [Ready to data output cycle (data only)], the read data is loaded into a register and is available for output during the three data out (DOUT) cycles, with data elements D0 through D2, respectively, being transferred.

FIG. 5B illustrates various signals 550 for an exemplary read operation with one or more emulated read errors, where the read page, for example, is configured to fail read operations with an exemplary all 1s pattern (e.g., an erased page), in accordance with one or more embodiments of the present disclosure. As shown in FIG. 5B, the cycle type 560 identifies the transferred information type, the DQx signal 570 indicates what is actually transferred for each clock cycle of the read operation and the SR[6] signal 580 indicates the portions of the read transfer time, in a similar manner as FIG. 5A.

The read operation with one or more emulated read errors is shown in FIG. 5B, where the flash error emulation module 310 has modified the read data in the DOUT cycles of the DQx signal 570 with all binary one values (all 1s), each with a data value of binary one being transferred.

Program Error Emulation

In some embodiments, if a user configures a page, for example, for a program error, the user can specify the type of response to send for a program error from the following exemplary list (each discussed separately below):
 a. Fail Status;
 b. Busy Status;
 c. Incorrect Data; and
 d. All 1s Data.

Fail Status:

If a user configures a page, for example, to fail program operations with a fail response, then the flash error emulation module 310, in response to receiving a program command, checks if the received program command is for a page configured for program errors. If the current page is configured for program errors, the flash error emulation module 310 will set the fail bit using a status 330 stored in the status buffer 210.

As the SSD controller 104 sends Read Status/Read Status Enhanced commands to identify a completion of the program command, the SSD controller 104 will receive a fail response from the virtual flash device 302.

Busy Status:

If a user configures a page, for example, to fail program operations with a busy response, then the flash error emulation module 310, in response to receiving a program command, checks if the received program command is for a page configured for program errors. If the current page is configured for program errors, the flash error emulation module 310 will set the busy bit using a status 330 stored in the status buffer 210.

As the SSD controller 104 sends Read Status/Read Status Enhanced commands to identify a completion of the program command, the SSD controller 104 will keep receiving a busy response from the virtual flash device 302.

Incorrect Data:

If a user configures a page, for example, to fail program operations with incorrect data, then the flash error emulation module 310, in response to receiving a program command, checks if the received program command is for a page configured for program errors. If the current page is configured for program errors, the flash error emulation module 310 will introduce one or more random bit flips in the data 315 that was read from the DDR 110, during a subsequent read operation of the previously stored data, and make the modified data 315 available in the data buffer 206 for the SSD controller 104 to read. In this manner, as the SSD controller 104 reads out the data 315, the SSD controller 104 will receive the modified data with the one more flipped bits.

In a further variation, bit flips may be performed while writing the data 315 to the DDR 110 for a program command, instead of flipping bits while reading the data 315 from the DDR 110 during a read command, as with the prior embodiment.

All 1s Data:

If a user configures a page, for example, to fail program operations with an all 1s data pattern, then the flash error emulation module 310, in response to receiving a read command, checks if the received program command is for a page configured for program errors. If the current page is configured for program errors, the flash error emulation module 310 will set an all 1s pattern in the data buffer 206 and make the modified data 315 available for the SSD controller 104 to read for consecutive reads on this page. In this manner, as the SSD controller 104 reads out the data 315, the SSD controller 104 will receive the modified data 315 with an erased page (e.g., empty page data).

In a further variation, the data 315 can be modified to the all 1s pattern by the flash error emulation module 310 while writing the data 315 to the DDR 110 for a program command, instead of applying the all 1s pattern while reading the data 315 from the DDR 110 during a read command, as with the prior embodiment.

Figure 6A:
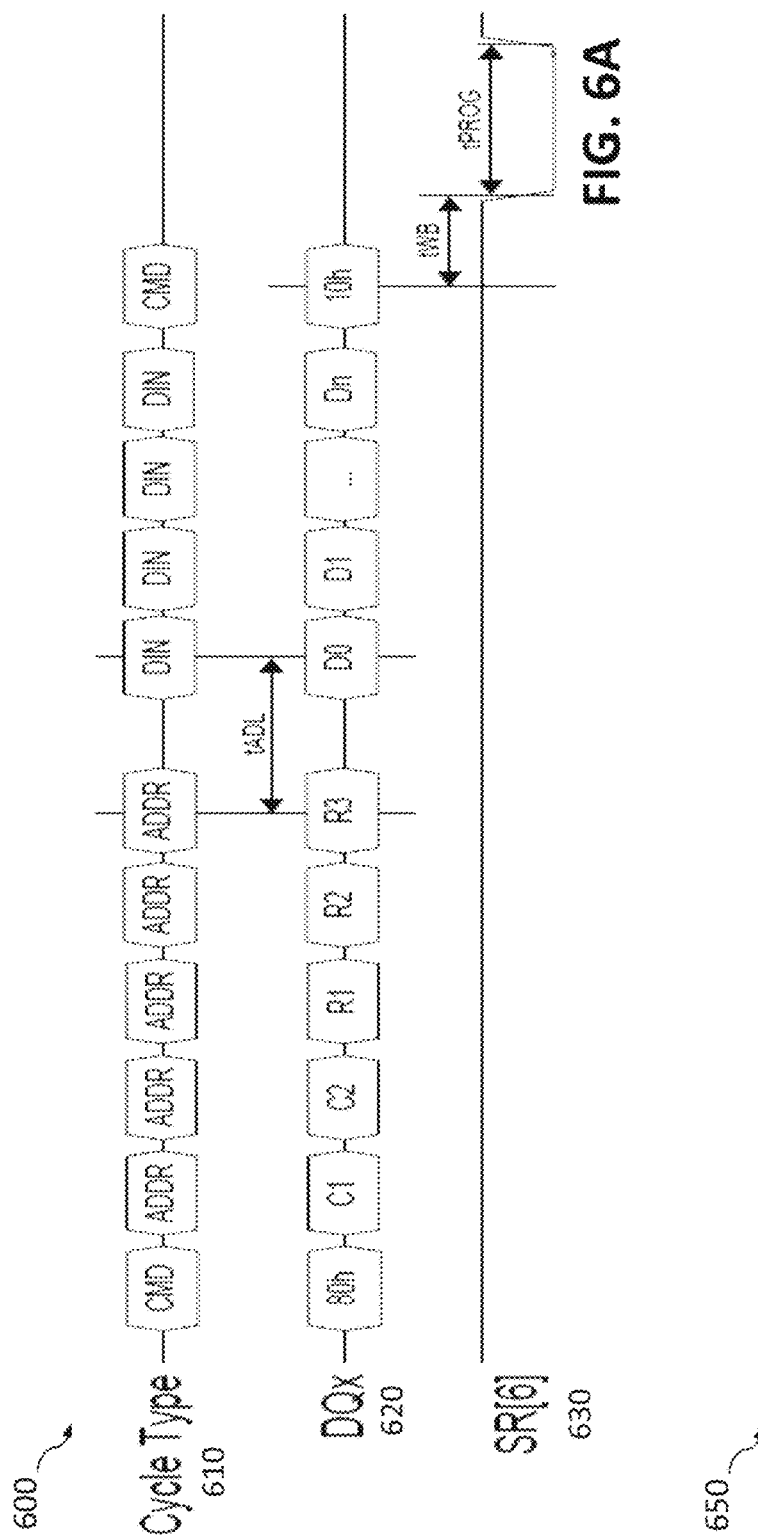
FIGS. 6A and 6B illustrate various signals for an exemplary program request operation and for a program response operation with one or more emulated program errors, respectively, in accordance with one or more embodiments of the present disclosure.

FIG. 6A illustrates various signals 600 for an exemplary program request operation, respectively, in accordance with at least one embodiment of the present disclosure. As shown in FIG. 6A, for a typical program operation, the cycle type 610 identifies the information type of what is transferred for each clock cycle, and the DQx signal 620 indicates what is actually transferred for each clock cycle. In the exemplary embodiment, a program operation starts with a program page (80h) command, followed by five address cycles C1-C2 and R1-R3 to identify the target program location. After the command and address are input, (where the SR[6] [Status Register $6^{th}$ bit] signal 630 comprises time tADL [ALE to data loading time]), the program data D0-Dn is loaded into an input register over corresponding clock cycles DIN. Once the program data has been input, the 10h command is issued to confirm the previous command and perform the program operation over a time tWB and tPROG.

Figure 6B:
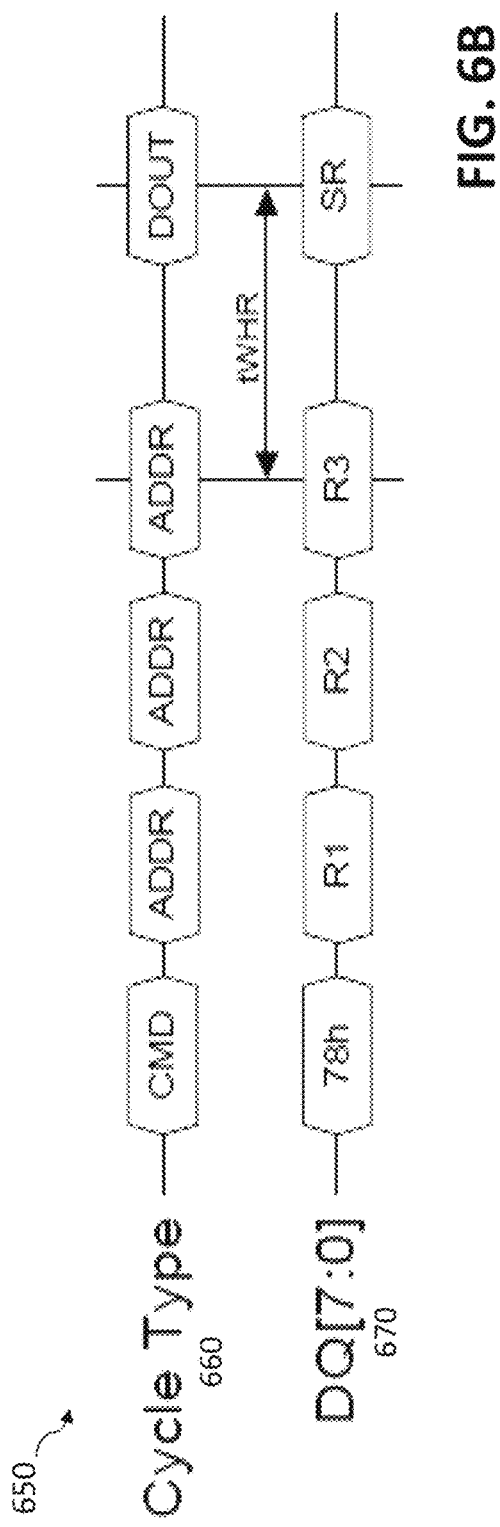

FIG. 6B illustrates various signals 650 for an exemplary program response operation with one or more emulated program errors by setting a Fail/Busy status bit, in accordance with one or more embodiments of the present disclosure. As shown in FIG. 6B, the cycle type 660 identifies the transferred information type, and the DQx signal 670 indicates what is actually transferred for each clock cycle of the program response operation, in a similar manner as FIG. 6A.

The program response operation (command 78h) with one or more emulated program errors is shown in FIG. 6B, where the flash error emulation module 310 has modified the status register (SR) to set the Fail bit and/or the Status bit for the indicated target address R1-R3 during the DOUT clock cycle.

Erase Error Emulation

In some embodiments, if a user configures a block, for example, to fail with an erase error, the user can specify the type of response to send for an erase error from the following exemplary list (each discussed separately below):

a. Fail Status;
b. Busy Status; and
c. Incorrect Data.

Fail Status:

If a user configures a block, for example, to fail with an erase error using a fail response, then the flash error emulation module 310, in response to receiving an erase command, checks if the current block is configured for erase errors. If the current block is configured for erase errors, the flash error emulation module 310 will set the fail bit using a status 330 stored in the status buffer 210.

As the SSD controller 104 sends Read Status/Read Status Enhanced commands to identify a completion of the erase command, the SSD controller 104 will receive a fail response from the virtual flash device 302.

Busy Status:

If a user configures a block, for example, to fail with an erase error using a busy response, then the flash error emulation module 310, in response to receiving an erase command, checks if the current block is configured for erase errors. If the current block is configured for erase errors, the flash error emulation module 310 will set the busy bit using a status 330 stored in the status buffer 210.

As the SSD controller 104 sends Read Status/Read Status Enhanced commands to identify a completion of the erase command, the SSD controller 104 will keep receiving a busy response from the virtual flash device 302.

Incorrect Data:

If a user configures a block, for example, to fail with an erase error using incorrect data, then the flash error emulation module 310, in response to receiving an erase command, checks if the received erase command is for a block configured for erase errors. If the current block is configured for erase errors, the flash error emulation module 310 will set the data buffer 206 with one or more random bit flips (or garbage data) instead of sending an all 1s pattern to the DDR 110. Thereafter, the data 315 that is read from the DDR 110, during a subsequent read operation of the previously stored data, is made available as modified data 315 in the data buffer 206 for the SSD controller 104 to read. In this manner, as the SSD controller 104 reads out the data 315, the SSD controller 104 will receive the modified data with the one more flipped bits (or garbage data), as opposed to the expected all 1s pattern.

The program command following the erase command can also be configured to fail, in some embodiments.

Figure 7A:
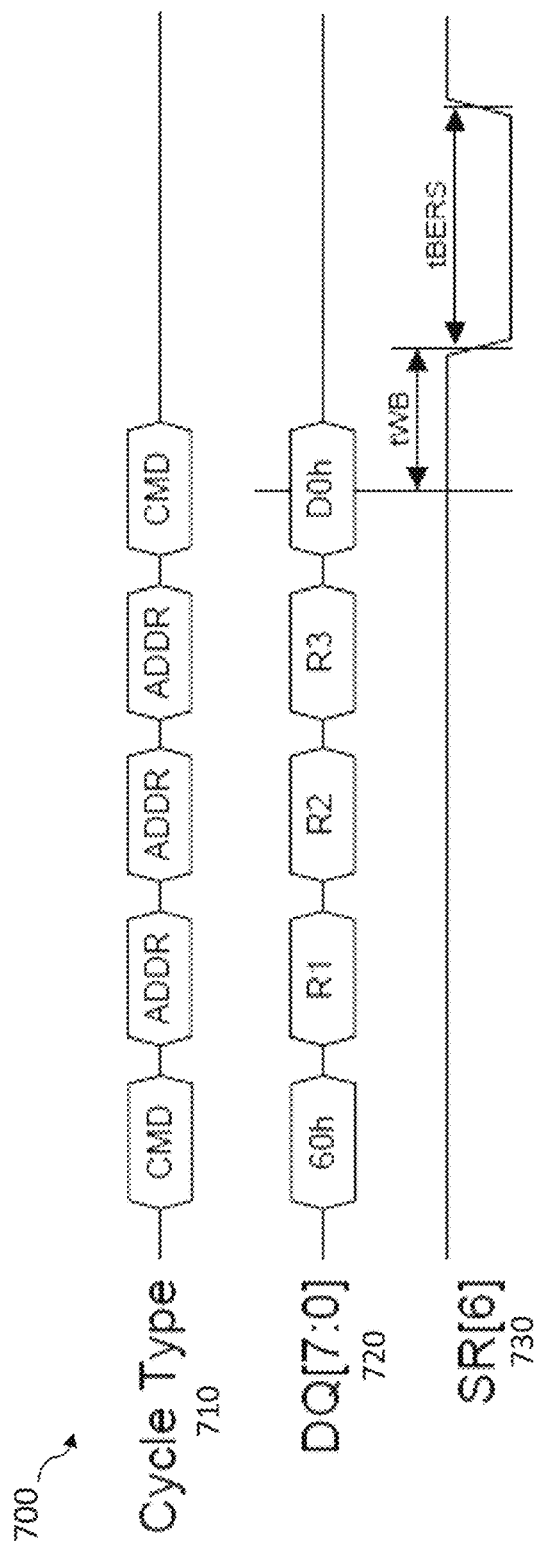
FIGS. 7A and 7B illustrate various signals for an exemplary erase request operation and for an erase response operation with one or more emulated erase errors, respectively, in accordance with at least one embodiment of the present disclosure.

FIG. 7A illustrates various signals 700 for an exemplary erase request operation, in accordance with at least one embodiment of the present disclosure. As shown in FIG. 7A, for a typical erase request operation, the cycle type 710 identifies the information type of what is transferred for each clock cycle, and the DQx signal 720 indicates what is actually transferred for each clock cycle. In the exemplary embodiment, an erase request operation starts with a block erase (60h) command, followed by three address cycles R1-R3 to identify the target block (e.g., 64 pages). After the address is input, the second erase command D0h) is issued to confirm the erase operation and perform the erase operation over a period of time tWB and tBERS., as shown by the SR[6] signal 730.

Figure 7B:
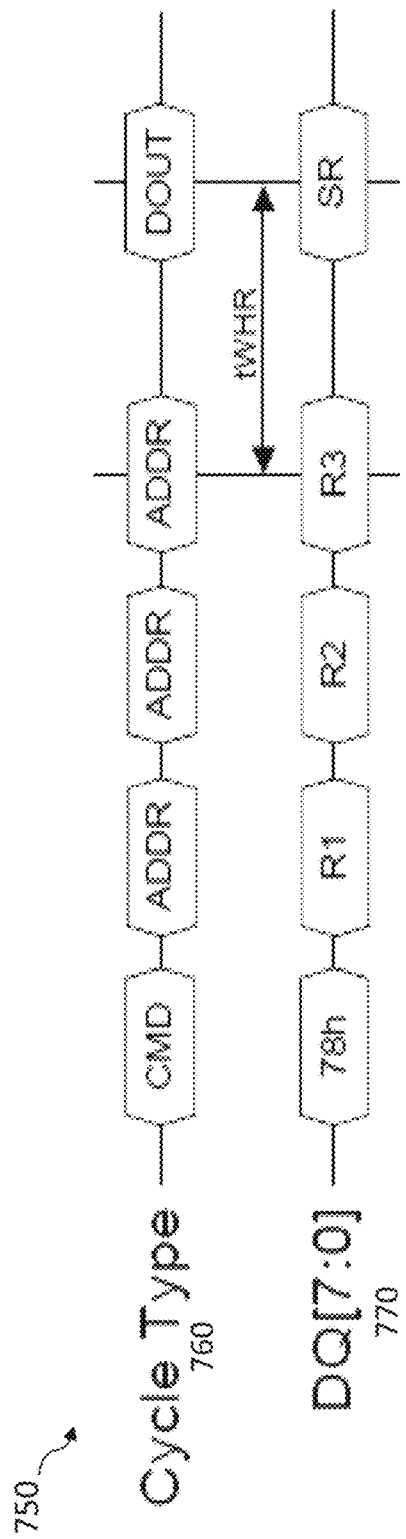

FIG. 7B illustrates various signals 750 for an exemplary erase response operation with one or more emulated erase errors, in accordance with at least one embodiment of the present disclosure. As shown in FIG. 7B, the cycle type 760 identifies the transferred information type, and the DQx signal 770 indicates what is actually transferred for each clock cycle of the erase response operation, in a similar manner as FIG. 7A.

The erase response operation (command 78, e.g., a command for obtaining a status of one or more program/erase operations) with one or more emulated erase errors is shown in FIG. 7B, where the flash error emulation module 310 has modified the status register (SR) to set the Fail bit and/or the Busy bit for the indicated target address R1-R3 during the DOUT clock cycle.

Block Failure Emulation

In one or more embodiments, if a user configures a block, for example, to fail with a block failure error, the exemplary flash error emulation module 310 will send an error response to the SSD controller 104 for all commands, such as read, program and erase commands that are sent on this block. In some embodiments, the user can also configure the type of errors that will be sent to controller for each command (e.g., for read, program and erase errors).

Figure 8:
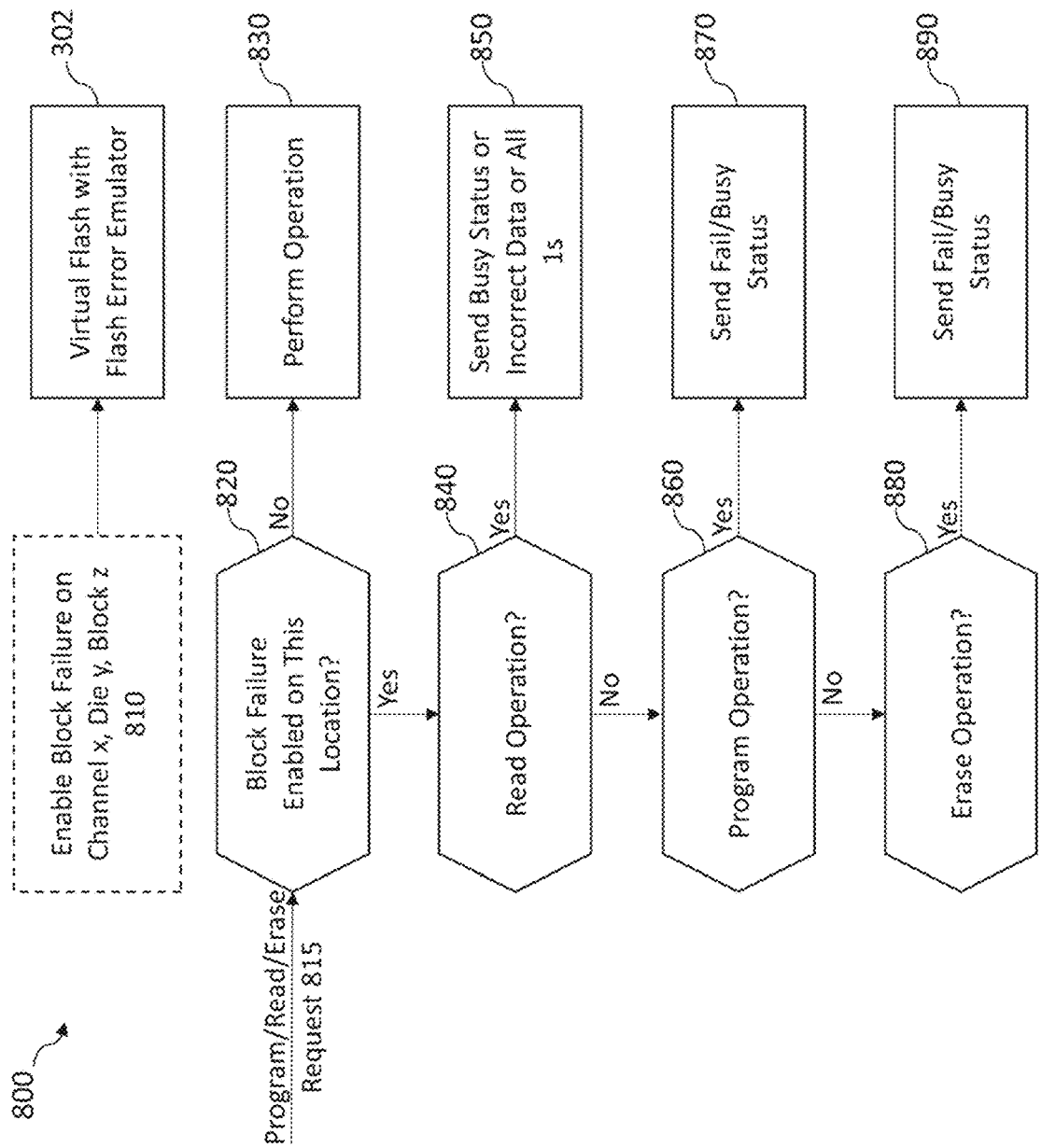
FIG. 8 is a flow chart illustrating an exemplary implementation of a block failure error emulation process, according to one embodiment of the disclosure.

FIG. 8 is a flow chart illustrating an exemplary implementation of a block failure error emulation process 800, according to one embodiment of the disclosure. As shown in FIG. 8, the exemplary block failure error emulation process 800 initially receives a user configuration enabling a block failure on channel x, die y, block z during step 810 with the virtual flash with flash error emulator 302.

Thereafter, in response to a Program/Read/Erase Request 815, the exemplary block failure error emulation process 800 determines if a block failure is enabled on the indicated location during step 820. If a block failure is not enabled on the indicated location, then the operation is performed during step 830.

If a block failure is enabled on this location, a test is performed during step 840 to determine if the operation is a read operation. If the operation is a read operation, then the flash error emulation module 310 sends a Busy Status or Incorrect Data or an All 1s pattern during step 850.

If the operation is not a read operation, then a further test is performed during step 860 to determine if the operation is a program operation. If the operation is a program operation, then the flash error emulation module 310 sends a Fail Status or a Busy Status during step 870.

If the operation is not a program operation, then a further test is performed during step 880 to determine if the operation is an erase operation. If the operation is an erase operation, then the flash error emulation module 310 sends a Fail Status or a Busy Status during step 890.

Die Failure Emulation

In one or more embodiments, if a user configures a die, for example, to fail with a die failure error, the exemplary flash error emulation module 310 will send an error response to the SSD controller 104 for all commands, such as read, program and erase commands that are sent on this die. In some embodiments, the user can also configure the type of errors that will be sent to controller for each command (e.g., for read, program and erase errors); and/or to send a Fail Status for non-data commands that are sent to this die.

Figure 9:
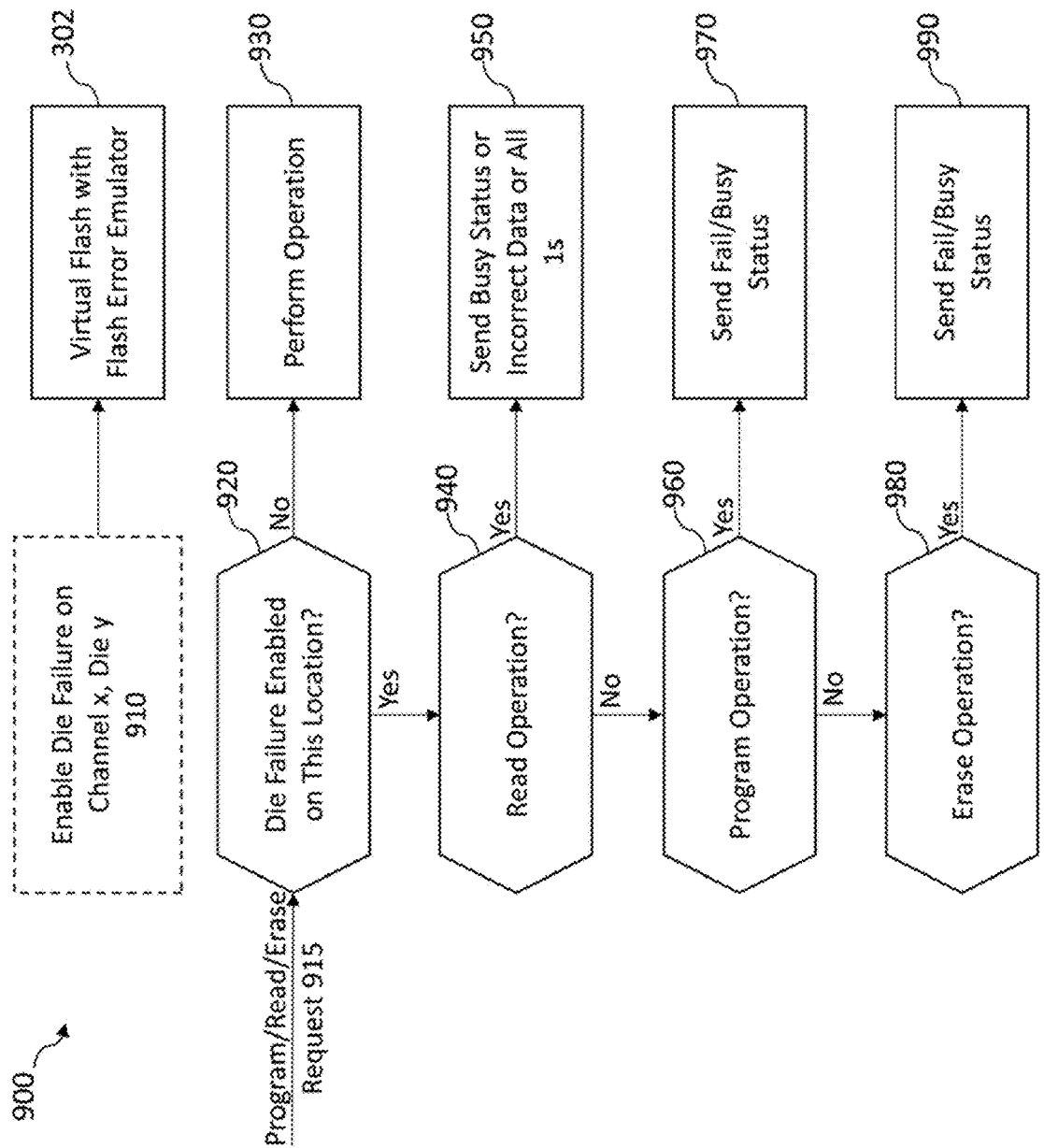
FIG. 9 is a flow chart illustrating an exemplary implementation of a die failure error emulation process, according to an embodiment of the disclosure.

FIG. 9 is a flow chart illustrating an exemplary implementation of a die failure error emulation process 900, according to an embodiment of the disclosure. As shown in FIG. 9, the exemplary die failure error emulation process 900 initially receives a user configuration enabling a die failure on channel x, die y during step 910 with the virtual flash with flash error emulator 302.

Thereafter, in response to a Program/Read/Erase Request 915, the exemplary die failure error emulation process 900 determines if a die failure is enabled on the indicated location during step 920. If a die failure is not enabled on the indicated location, then the operation is performed during step 930.

If a die failure is enabled on this location, a test is performed during step 940 to determine if the operation is a read operation. If the operation is a read operation, then the flash error emulation module 310 sends a Busy Status or Incorrect Data or an All 1s pattern during step 950.

If the operation is not a read operation, then a further test is performed during step 960 to determine if the operation is a program operation. If the operation is a program operation, then the flash error emulation module 310 sends a Fail Status or a Busy Status during step 970.

If the operation is not a program operation, then a further test is performed during step 980 to determine if the operation is an erase operation. If the operation is an erase operation, then the flash error emulation module 310 sends a Fail Status or a Busy Status during step 990.

Read Only Mode/End of Life Mode

To emulate an end of life mode, for example, a user can set an end of life error type. In one or more embodiments, the flash error emulation module 310 will only send correct data for read and non-data commands. In some embodiments, for erase and program commands, the flash error emulation module 310 will set a fail bit in the status buffer 210. Thus, for erase and program commands, the SSD controller 104 will receive a fail status.

Figure 10:
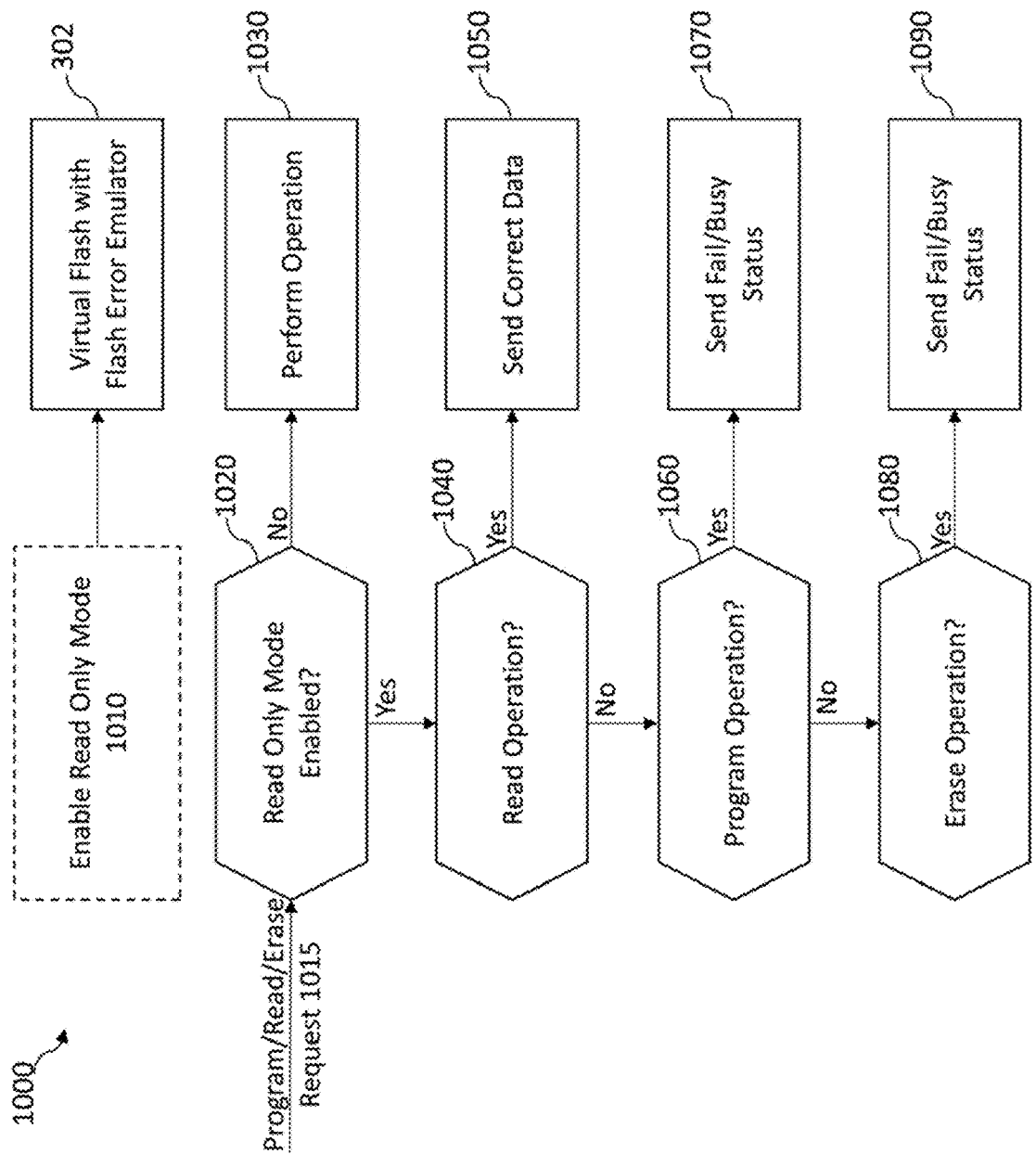
FIG. 10 is a flow chart illustrating an exemplary implementation of a read only mode/end of life mode error emulation process, according to at least one embodiment of the disclosure.

FIG. 10 is a flow chart illustrating an exemplary implementation of a read only mode/end of life mode error emulation process 1000, according to at least one embodiment of the disclosure. As shown in FIG. 10, the exemplary read only mode/end of life mode error emulation process 1000 initially receives a user configuration enabling a read only mode, for example, during step 1010 with the virtual flash with flash error emulator 302.

Thereafter, in response to a Program/Read/Erase Request 1015, the exemplary read only mode/end of life mode error emulation process 1000 determines if a read only mode is enabled during step 1020. If a read only mode is not enabled on the indicated location, then the operation is performed during step 1030.

If a read only mode is enabled on this location, a test is performed during step 1040 to determine if the operation is a read operation. If the operation is a read operation, then the flash error emulation module 310 sends Correct Data during step 1050.

If the operation is not a read operation, then a further test is performed during step 1060 to determine if the operation is a program operation. If the operation is a program operation, then the flash error emulation module 310 sends a Fail Status or a Busy Status during step 1070.

If the operation is not a program operation, then a further test is performed during step 1080 to determine if the operation is an erase operation. If the operation is an erase operation, then the flash error emulation module 310 sends a Fail Status or a Busy Status during step 1090.

Conclusion

In one or more embodiments of the disclosure, techniques are provided for testing error functionality of a flash controller using a virtual flash system comprising a flash error emulation module. It should be understood that the flash error emulation arrangements illustrated in FIGS. 1 through 10 are presented by way of illustrative example only, and should not be construed as limiting in any way. Numerous alternative configurations of system and device elements and associated processing operations can be used in other embodiments.

Illustrative embodiments disclosed herein can provide a number of significant advantages relative to conventional arrangements. For example, one or more embodiments provide improved testing of the error functionality of a flash controller using a virtual flash system.

It is to be appreciated that the particular advantages described above and elsewhere herein are associated with particular illustrative embodiments and need not be present in other embodiments. Also, the particular types of flash error emulation features and functionality as illustrated in the drawings and described above are exemplary only, and numerous other arrangements may be used in other embodiments.

As mentioned previously, at least portions of the disclosed flash error emulation system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

The disclosed flash error emulation arrangements may be implemented using one or more processing platforms. One or more of the processing modules or other components may therefore each run on a computer, storage device or other processing platform element. A given such element may be viewed as an example of what is more generally referred to herein as a "processing device."

Figure 11:
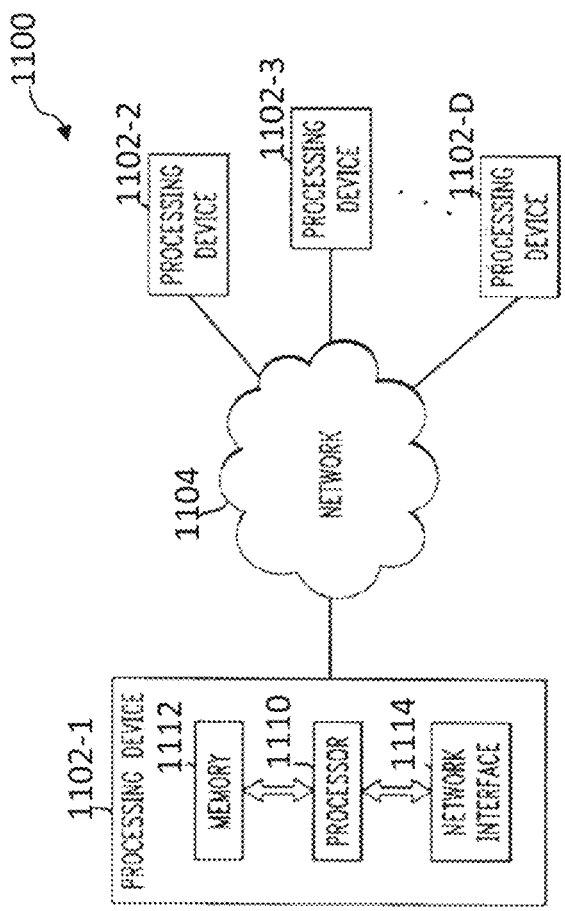
FIG. 11 illustrates a processing platform that may be used to implement at least a portion of one or more embodiments of the disclosure.

Referring now to FIG. 11, one possible processing platform that may be used to implement at least a portion of one or more embodiments of the disclosure is shown. The processing platform 1100 in this embodiment comprises at least a portion of the given system and includes at least one processing device(s), denoted 1102-1, 1102-2, 1102-3, . . . 1102-D, which communicate with one another over a network 1104. The network 1104 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 1102-1 in the processing platform 1100 comprises a processor 1110 coupled to a memory 1112. The processor 1110 may comprise a microprocessor, a microcontroller, an application specific integrated circuit (ASIC), a field programmable gate array (FPGA) or other type of processing circuitry, as well as portions or combinations of such circuitry elements. The memory 1112 may comprise random access memory (RAM), read only memory (ROM) or other types of memory, in any combination. The memory 1112 and other memories disclosed herein should be viewed as illustrative examples of what are more generally referred to as "processor-readable storage media" storing executable program code of one or more software programs.

Also included in the processing device 1102-1 is network interface circuitry 1114, which is used to interface the processing device with the network 1104 and other system components, and may comprise conventional transceivers.

The other processing devices 1102, if any, of the processing platform 1100 are assumed to be configured in a manner similar to that shown for processing device 1102-1 in the figure.

Again, the particular processing platform 1100 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 11, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 1100 shown in FIG. 11 is presented by way of example only, and the flash error emulation system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the flash error emulation system. Such components can communicate with other elements of the flash error emulation system over any type of network or other communication media.

As indicated previously, components of an information processing system as disclosed herein can be implemented at least in part in the form of one or more software programs stored in memory and executed by a processor of a processing device. For example, at least portions of the functionality of the exemplary virtual flash process 400 with flash error emulation of FIG. 4 and/or the error emulation processes 800, 900, 1000 of FIGS. 8-10, respectively, are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and flash error emulation systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus, comprising:
    a virtual solid state storage device configured to emulate a solid state storage device to a solid state storage controller, the virtual solid state storage device comprising:
        a solid state storage interface configured to communicate with the solid state storage controller utilizing a solid stage storage protocol of the emulated solid state storage device,
        a non-flash memory device utilized for storage of data that would otherwise be stored to the emulated solid state storage device,
        an address translation module configured to translate memory addresses from a solid state storage-based memory space of the emulated solid state storage device to a second memory space of the non-flash memory device,
        a non-solid state storage memory controller in a data path between the solid state storage interface and the non-flash memory device configured to communicate with the non-flash memory device; and
        a solid state storage error module in the data path between the solid state storage interface and the non-flash memory device and configured to emulate solid state storage errors of the emulated solid state storage device for testing error handling functions of the solid state storage controller for one or more predefined error types of the emulated solid state storage memory device by flipping one or more bits of data transferred along the data path between the solid state storage interface and the non-flash memory device.

2. The apparatus of claim 1, wherein the flipping one or more bits comprises one or more of: (a) setting bits corresponding to a given page of the addresses from the solid state storage-based memory space to values of binary one and (b) introducing one or more random errors into bits of the given page.

3. The apparatus of claim 1, wherein the solid state storage error module flips the one or more bits to simulate one or more of the predefined error types of the emulated solid state storage memory device.

4. The apparatus of claim 1, wherein the solid state storage error module further emulates solid state storage errors by changing a status response sent to the solid state storage controller for one or more solid state storage commands to a predefined status response to simulate one or more of the predefined error types of the emulated solid state storage memory device.

5. The apparatus of claim 1, wherein the one or more error handling functions of the solid state storage controller comprise one or more of: (a) error detection functions; and (b) error correction functions.

6. The apparatus of claim 1, wherein the non-flash memory device comprises a DDR SDRAM (double data rate synchronous dynamic random access memory) memory device and wherein the virtual solid state storage device is implemented as a field programmable gate array (FPGA).

7. The apparatus of claim 1, wherein the one or more predefined error types of the emulated solid state storage memory device comprise one or more of: read errors, program errors, erase errors, block failures, die failures, and read only mode/end of life mode errors.

8. The apparatus of claim 7, wherein the read only mode/end of life mode errors are emulated by sending correct data read from the non-flash memory device for read commands and non-data commands and setting a failing bit in a status response for erase commands and program commands.

9. A method, comprising:
    configuring a virtual solid state storage device to emulate a solid state storage memory device to a solid state storage controller, the virtual solid state storage device comprising:
        a solid state storage interface configured to communicate with the solid state storage controller utilizing a solid stage storage protocol of the emulated solid state storage memory device,
        a non-flash memory device utilized to provide storage of data that would otherwise be stored to the emulated solid state storage memory device,
        an address translation module configured to translate memory addresses from a solid state storage-based memory space of the emulated solid state storage memory device to a second memory space of the non-flash memory device,
        a non-solid state storage memory controller in a data path between the solid state storage interface and the non-solid state memory device configured to communicate with the non-flash memory device, and
        a solid state storage error module in the data path between the solid state storage interface and the non-flash memory device; and
    testing one or more error handling functions of the solid state storage controller using the solid state storage error module to emulate solid state storage errors for one or more predefined error types of the emulated solid state storage memory device by flipping one or more bits of data transferred along the data path between the solid state storage interface and the non-flash memory device.

10. The method of claim 9, wherein the flipping one or more bits comprises one or more of: (a) setting bits corresponding to a given page of the addresses from the solid state storage-based memory space to values of binary one and (b) introducing one or more random errors into bits of the given page.

11. The method of claim 9, wherein the solid state storage error module flips the one or more bits to simulate one or more of the predefined error types of the emulated solid state storage memory device.

12. The method of claim 9, wherein the solid state storage error module further emulates solid state storage errors by changing a status response sent to the solid state storage controller for one or more solid state storage commands to a predefined status response to simulate one or more of the predefined error types of the emulated solid state storage memory device.

13. The method of claim 9, wherein the one or more error handling functions of the solid state storage controller comprise one or more of: (a) error detection functions; and (b) error correction functions.

14. The method of claim 9, wherein the one or more predefined error types of the emulated solid state storage memory device comprise one or more of: read errors, program errors, erase errors, block failures, die failures, and read only mode/end of life mode errors.

15. A virtual storage system, comprising:
a non-flash memory device; and
a virtual solid state storage device configured to emulate a solid state storage memory device to a solid state storage controller, the virtual solid state storage device comprising:
    a solid state storage interface configured to communicate with the solid state storage controller utilizing a solid stage storage protocol of the emulated solid state storage memory device,
    a non-solid state storage memory controller configured to allow the virtual solid state storage device to store data to and retrieve data from the non-flash memory device to emulate storage of the data in the emulated solid state storage memory device,
    an address translation module configured to translate memory addresses from a solid state storage-based memory space of the emulated solid state storage memory device to a second memory space of the non-flash memory device,
    a solid state storage error module in a data path between the solid state storage interface and the non-solid state storage memory controller and configured to emulate solid state storage errors of the emulated solid state storage memory device for testing error handling functions of the solid state storage controller for one or more predefined error types of the emulated solid state storage memory device by flipping one or more bits of data transferred along the data path between the solid state storage interface and the non-solid state storage memory controller.

16. The virtual storage system of claim 15, wherein the flipping one or more bits comprises one or more of: (a) setting bits corresponding to a given page of the addresses from the solid state storage-based memory space to values of binary one and (b) introducing one or more random errors into bits of the given page.

17. The virtual storage system of claim 15, wherein the one or more error handling functions of the solid state storage controller comprise one or more of: (a) error detection functions; and (b) error correction functions.

18. The virtual storage system of claim 15, wherein the one or more predefined error types of the emulated solid state storage memory device comprise one or more of: read errors, program errors, erase errors, block failures, die failures, and read only mode/end of life mode errors.

\* \* \* \* \*